United States Patent [19]

Clark

[11] Patent Number: 4,600,611
[45] Date of Patent: Jul. 15, 1986

[54] FILM CARRIER FOR MANUFACTURING SEMICONDUCTOR DEVICES

[75] Inventor: James W. Clark, San Jose, Calif.

[73] Assignee: Fairchild Semiconductor Corporation, Cupertino, Calif.

[21] Appl. No.: 730,663

[22] Filed: May 2, 1985

[51] Int. Cl.⁴ .................. B32B 3/10; H01L 23/02; H01L 23/12
[52] U.S. Cl. .................... 428/13; 428/120; 428/137; 357/70; 357/74
[58] Field of Search ............ 357/72, 70, 74; 428/120, 131, 137, 13

[56] References Cited

U.S. PATENT DOCUMENTS 4,007,479 2/1977 Kowalski ............... 357/70
4,069,496 1/1978 Kowalski ............... 357/70

Primary Examiner—Alexander S. Thomas
Attorney, Agent, or Firm—David H. Sitrick

[57] ABSTRACT

An improved film carrier for affixing both two and three layer films used in tape automated bonding processes for the manufacture of semiconductor devices is disclosed. The carrier uses pegs to substantially match the sprocket holes in the film, thereby eliminating distortion in the film or the leads wires affixed in the film caused by prior art structures which force the film strips between holes to be bent in placing the film in the carrier.

1 Claim, 7 Drawing Figures

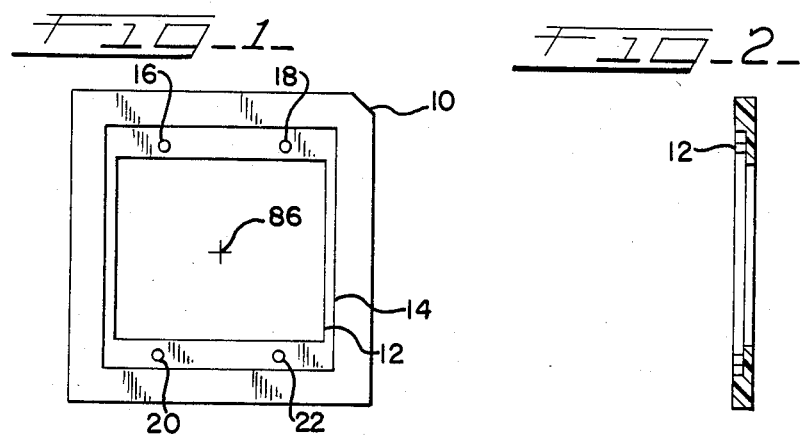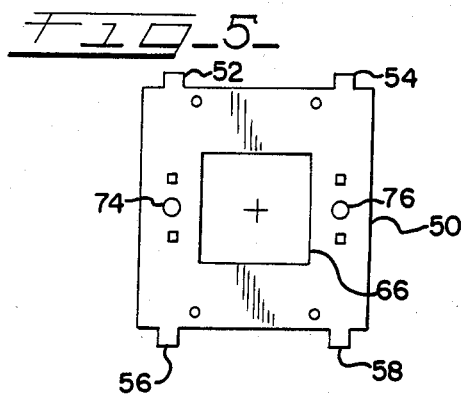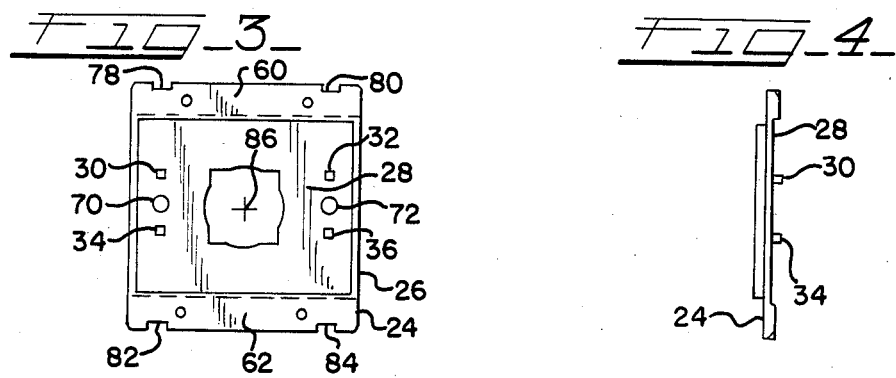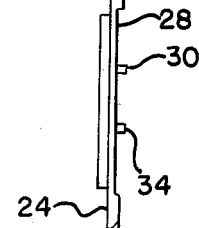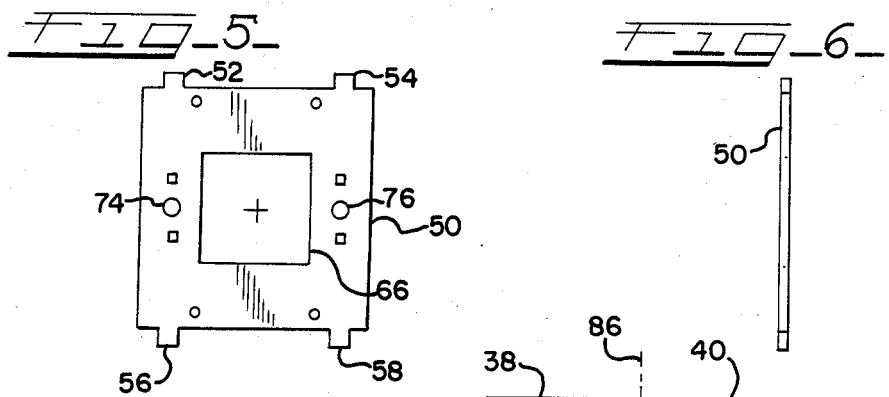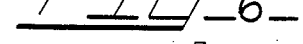

FILM CARRIER FOR MANUFACTURING SEMICONDUCTOR DEVICES

BACKGROUND OF THE INVENTION

The present invention relates generally to the manufacture of semiconductor devices and in particular to a frame for processing, handling, and transporting of film having lead wires for semiconductor devices affixed therein. The device can also be used as a shipping container for semiconductor devices.

In the manufacture of semiconductor devices, one of the commonly required steps is the bonding of a semiconductor chip to an array of lead wires. One method presently used is to affix lead wire arrays in either two or three layer film strips adapted for bonding to individual chips. The film is carried in a series of individual frames. Each frame has one frame of film having an individual lead wire array. Precise alignment of the film to the chip is essential in order to have the correct contacts between the lead wires and the appropriate contact points on the chip.

Prior art devices have disclosed a slide carrier for three layer tape that encapsulates the film between sprocket holes. However three layer tape has no metalized layer of material in the sprocket hole area. Two layer tape has a metalized layer of material covering the extreme boundaries of the tape. It has been found in attempting to load two layer tape into a three layer slide carrier that the metalized layer or lead lines can be damaged and become an unusable product.

Accordingly, it is an object of the present invention to provide a slide carrier for both three and two layer tapes that precisely positions the tape without damaging the metalized layer of two layer tape.

It is an additional objective of the present invention to provide a slide carrier which protects the semiconductor device and eases the loading of a single frame of film into the slide carrier.

It is an additional object of the present invention to provide a slide carrier that can be used in the the manufacture and shipment of film carried semiconductor devices.

BRIEF DESCRIPTION OF THE DRAWINGS

FIG. 1 of the drawings is a top view of a carrier frame for thirty-five millimeter film used in the manufacture of semiconductor devices.

FIG. 2 of the drawings is a side cutaway view of the carrier frame of FIG. 1.

FIG. 3 of the drawings is a top view of a film carrier and locator plate constructed and arranged for insertion into the carrier frame of FIG. 1.

FIG. 4 of the drawings is a side view of the film carrier and locator plate of FIG. 3.

FIG. 5 of the drawings is a cover for the film carrier and locator plate of FIG. 3 of the drawings.

FIG. 6 of the drawings is a side view of the cover of FIG. 5.

FIG. 7 of the drawings is a top view of a film frame having a semiconductor device bonded thereon to a lead wire array which is carried in the carrier frame of FIGS. 1-6.

DETAILED DESCRIPTION OF THE PREFERRED EMBODIMENT

The present invention discloses a carrier for thirty-five millimeter film used in the bonding of semiconductor chips to a lead wire array affixed to or in the film. The use of a three part carrier assembly allows the film to be positioned to within ten thousandths of an inch in both the x and y dimensions without damaging the metallic layer of the film or the film itself.

Turning now to FIG. 1 of the drawings, a carrier frame 10 is shown having a central aperture 12 substantially rectangular in shape extending therethrough. In addition to central aperture 12, carrier frame 10 has a ledge 14 substantially rectangular in shape which is arrayed about the periphery of the aperture 12. Extending from ledge 14 are a plurality of pins 16, 18, 20 and 22 which extend perpendicularly from the ledge 14 and which are adapted for mating engagement with film carrier 24, best seen in FIG. 3.

As best seen in FIGS. 3 and 4, film carrier 24 is substantially planar and rectangular in shape and is adapted for insertion into and fixed positioning on ledge 14 of carrier frame 10. Film carrier 24 is more properly called a film carrier and locator plate because it has an internal recess 26 which is substantially rectangular in shape and has a film receiving panel 28 across the recess 26 for both receiving and locating a film frame 46.

As best seen in FIGS. 3 and 4 of the drawings, film receiving panel 28 has alignment pins 30, 32, 34 and 36 extending perpendicularly therefrom. Alignment pins 30–36 are separated the proper distance for mating engagement with the sprocket holes 38, 40, 42 and 44 in a single frame of film 46. Thus, film frame 46 (best seen in FIG. 7 of the drawings) is inserted into film carrier and alignment plate 28, and pins 30–36 are inserted into sprocket holes 38, 40, 42 and 44. Pins 30–36 are preferably rectangular and are at least five thousandths smaller than sprocket holes 38–44, so as to allow a limited degree of mobility of film frame 46 in film carrier and alignment plate 24.

As seen in FIGS. 5 and 6 of the drawings, cover 50 is adapted for placement over film carrier 24. Cover 50 has flanges 52, 54, 56 and 58 extending therefrom. In particular, film carrier 24 has shoulders 60 and 62 oppositely disposed on film carrier 24 which are adapted for supporting cover 50 over recess 26, with film strip 46 contained therein. As a result, film frame 46 may be contained within the recess 26 and substantially affixed in a stationery position without crimping or damage of the film or the lead wires 64 (best seen in FIG. 7) which form a part of film frame 46. Cover 50 further has a rectangular aperture 66 which extends therethrough for insertion and bonding of semiconductor chip 68 (best seen in FIG. 7) to film frame 46. Cover 50 may be fixedly attached or removed from film carrier 24 by crimping flanges 52-58 in slots 78, 80, 82 and 84.

As further seen in FIGS. 3 and 5, film carrier 24 and cover 50 have a pair of oppositely disposed center line sprocket holes which are used for receiving a pair of tooling pins (not shown) which extend from commonly known devices for aligning, inserting and bonding semiconductor chips to a film having a lead wire array disposed therein.

In operation, when film frame 46 is inserted into film carrier 24, alignment pins 30-36 are inserted into sprocket holes 38-44, and cover 50 is placed over film strip 46. The carrier frame 10 with film frame 46 contained therein may then be inserted into automated processing devices presently used in the industry where it is aligned under a semiconductor chip such as chip 68. Semiconductor 68 is then lowered onto the center axis 86 of the film carrier 10, in precise alignment with the lead wire 64 shown in FIG. 7. Support on the bottom side of carrier frame 10 is also provided along center axis 86. The chip may then be bonded to film strip 46 or the film strip may be crimped into a receiving cavity and the chip subsequently bonded. Following such bonding, the entire device may be electrically tested by a probe device having a plurality of fingers for testing the circuits of the assembled chip. Once the chip and lead wires have been tested the entire assembly continues in production into a packaging area where a cover (i.e. plastic, ceramic, etc.) is bonded around the entire assembly to protect it.

The present invention protects the semiconductor device and eases loading of the film strip into the slide carrier. Also, the snap in, snap out function of the film carrier allows for less weight in a smaller package size shipment. The primary function of the invention is the simplicity of loading the film frames, the safety in handling the film frames and the ability to use the device functionally on manual, semiautomatic and automatic production process equipment.

In a preferred embodiment, the film commonly used is thirty-five millimeter slide carrier film. Alignment pins 30–36 are adapted to accept standard thirty-five millimeter sprocketed film, three to six sprocket pitches in length. Alignment pins 30–36 are rectangular in shape so as to register in four sprocket holes of two pitches apart on each edge of the film. The size of the pins and the spacing allows the film to float about the central axis of the individual frame, plus or minus ten thousandths in both the x and y dimension.

The foregoing description and drawings merely explain and illustrate the invention, and the invention is not so limited thereto except insofar as those who have the disclosure before them will be able to make modifications and variations therein without departing from the scope of the invention.

What is claimed is:

1. An improved film carrier for film having serially arrayed laterally opposed sprocket holes disposed thereon, said film being utilized in the manufacture of semiconductor devices, said film carrier comprising:

a main frame member having an opening extending therethrough;

a snap in film carrier and locator plate having alignment pins extending therefrom, said pins being positioned for mating engagement with said sprocket holes in said film, said alignment pins being sized relative to said sprocket holes in such a manner that said film may float about the true center of said film carrier and locator plate, said film carrier and locator plate further having a pair of opposed center line holes positioned for insertion of process tooling pins, said film carrier and locator plate having a central aperture extending therethrough adapted for performing lead bonding of a semiconductor device to said film; and a cover plate constructed and arranged for mating engagement with said film carrier and locator plate so as to capture a single film frame within said film carrier and locator plate by interlocking with said alignment pins, said cover plate having an aperture extending therethrough for subsequent lead bonding and having a pair of opposed center line sprocket holes for reception of processing tooling pins.

* * * * *